United States Patent [19]

Nakata et al.

[11] Patent Number: 5,763,540

[45] Date of Patent: Jun. 9, 1998

[54] EPOXY RESIN COMPOSITION FOR ENCAPSULATING SEMICONDUCTOR

[75] Inventors: Yoshihiro Nakata; Yukio Takigawa; Shigeaki Yagi; Norio Sawatari, all of Kawasaki, Japan

[73] Assignee: Fujitsu Limited, Kawasaki, Japan

[21] Appl. No.: 544,670

[22] Filed: Oct. 18, 1995

Related U.S. Application Data

[62] Division of Ser. No. 350,387, Dec. 6, 1994, abandoned, which is a continuation of Ser. No. 63,653, May 20, 1993, abandoned.

[30] Foreign Application Priority Data

| May 22, 1992 | [JP] | Japan | 4-130860 |
| May 25, 1992 | [JP] | Japan | 4-132642 |
| May 26, 1992 | [JP] | Japan | 4-133888 |

[51] Int. Cl.$^6$ .................. C08L 63/00; C08L 83/07; C08G 77/20
[52] U.S. Cl. .................. 525/476; 528/32
[58] Field of Search ................ 525/476; 528/32

[56] References Cited

U.S. PATENT DOCUMENTS

| 2,445,794 | 7/1948 | Marsden | 528/32 |
| 4,778,871 | 10/1988 | Newhouse | 528/32 |
| 4,851,481 | 7/1989 | Kuriyama et al. | 525/476 |
| 5,035,927 | 7/1991 | Chen et al. | 427/444 |

OTHER PUBLICATIONS

Babu et al., Macromolecules, vol. 24, 4503–4509 (1991).

Y. Lai, P.R. Dvornic & R.W. Lenz; Journal of Polymer Science, Polymer Chemistry Edition, vol. 20, 2277–2288 (1982).

Y. Nagase, K. Ikeda & Y. Sekine; Chem. Abs., 98 (16), 126994, Polymer, 23 (11), 1646–1652 (1982).

M. Livingston, P.R. Dvornic & R.W. Lenz; Journal of Appl. Poly. Sci., 27, 3238–3251 (1982).

Noii, Chemistry and Technology of Silicones, pp. 139–140.

Primary Examiner—Donald R. Wilson
Attorney, Agent, or Firm—Staas & Halsey

[57] ABSTRACT

An epoxy resin composition for encapsulating semiconductors containing 5 to 50 parts by weight of a silicone-based flexibility imparting agent, 100 parts by weight of an epoxy resin containing at least two epoxy groups in one molecule thereof, 50 to 150 parts by weight of a curing resin including a phenolic resin, and 200 to 1,000 parts by weight of an inorganic filler.

4 Claims, 4 Drawing Sheets

Fig. 2

EPOXY RESIN COMPOSITION FOR ENCAPSULATING SEMICONDUCTOR

This application is a division of application Ser. No. 08/350,387, filed Dec. 6, 1994, abandoned, which in turn is a continuation of application Ser. No. 08/063,653, filed May 20, 1993 (abandoned).

BACKGROUND OF THE INVENTION

1. Field of the Invention

This invention relates to an epoxy resin composition for encapsulating semiconductors and also to a flexibility imparting agent for a thermosetting resin, capable of being used for such a resin composition.

2. Description of the Related Art

An encapsulating method using a thermosetting resin has been employed predominantly as a method of encapsulating electronic components such as ICs, LSIs, and so forth. However, the method using a resin is more economical and has higher mass-producibility than a hermetic seal system using a metal, ceramics, etc. An epoxy resin which has excellent moldability, moisture-proofness and electrical characteristics and which is economical has generally been used as a base resin for a resin composition for encapsulating semiconductors.

However, problems that cannot be solved by the conventional epoxy resin composition for semiconductors have arisen as packages have become smaller and smaller with the increase in the size of chips due to a higher integration density of LSIs, miniaturization of patterns, and higher density mounting.

In other words, resin molded LSIs comprise two materials having mutually different coefficients of thermal expansion, i.e., a resin and a Si chip. For this reason, a problem occurs that a stress acts between these materials and the LSI undergoes breakage. The greater the size of the chip, the greater becomes the influence due to this stress, and the LSIs are more likely to be damaged with a greater miniaturization of the patterns. The mode of damage of the LSIs due to the stress includes deformation and breakage of aluminum wirings, passivation cracks and package cracks. Accordingly, a semiconductor encapsulating resin which minimizes the stress acting on the chips has become necessary.

The stress (σ) which the Si chip receives from the molding resin (set material) can be expressed by the following formula by rough approximation:

$$\sigma = K \cdot \alpha \cdot E \quad (1)$$

K: proportional constant
α: coefficient of thermal expansion of encapsulating resin
E: modulus of elasticity of encapsulating resin.

Because the stress can be approximated by the formula (1) described above, a method of imparting flexibility and reducing the modulus of elasticity to the package by adding a flexibility imparting agent has been proposed in the past as a method of reducing the stress of a semiconductor encapsulating resin. According to this method, however, there is still a problem that moisture-proofness, heat-resistance, high temperature electrical characteristics and mechanical characteristics of the set resin deteriorate. It is believed effective to reduce the coefficient of thermal expansion of the set resin to reduce the stress, from the formula (1) given above. However, if a large amount of inorganic fillers are added so as to reduce the coefficient of thermal expansion, the melt viscosity of the resin rises, and this method results in the problems that deformation and breakage of bonding wires develop, unfilled portions of the resin occur inside a mold and a working factor of molding drops.

In other words, it has been extremely difficult according to the prior art to reduce the stress without deteriorating other characteristics of the resin such as moisture-proofness.

SUMMARY OF THE INVENTION

It is a primary object of the present invention to provide a resin composition for encapsulating semiconductors which solves the problems with the prior art described above, or in other words, which has excellent heat-resistance, flexibility, moisture-proofness and crack resistance.

To accomplish the object described above, the present invention provides an epoxy resin composition for encapsulating semiconductors, which comprises:

100 parts by weight of an epoxy resin containing at least two epoxy groups inside one molecule thereof;

50 to 150 parts by weight of a phenolic resin expressed by the following general formula (I), (II), (III) or (IV);

200 to 1,000 parts by weight of an inorganic filler; and

5 to 50 parts by weight of a silicone compound having a molecular weight of 500 to 100,000 and expressed by the following general formula (V), (VI), (VII) or (VIII);

(where $R_1$ is a hydrogen atom or a methyl group, and n is an integer of 0 to 10),

(where n is an integer of 0 to 10),

(where n is an integer of 0 to 10).

(where n is an integer of 0 to 10).

(where $R_1$ is a lower alkyl group, $R_2$ and $R_3$ are mutually independently a vinyl group or a lower alkyl group or a phenyl group, m and n are a positive integer, and n:m represents a proportion of 0.2:1 to 2:1), (where $R_1$ and $R_2$ may be the same or different and each represents mutually independently a lower alkyl group or a phenyl group, $R_3$ and $R_4$ may be the same or different and each represents mutually differently a lower alkyl group or a phenyl group, and n is a positive integer), (where $R_5$ is a lower alkyl group and n is a positive integer), (where $R_6$ is a lower alkyl group, $R_7$, $R_8$, $R_9$ and $R_{10}$ may be the same or different and each represents mutually independently a lower alkyl group or a phenyl group, m and n are a positive integer, and n:m represents a proportion of 0.2:1 to 2:1).

If desired, the epoxy resin composition for encapsulating semiconductors according to the present invention may further contain 5 to 30 parts by weight of a maleimide resin expressed by the following general formula (IX):

(IX)

(where k is an integer of 0 to 5).

The present invention provides further a flexibility imparting agent for a thermosetting resin containing a silicone compound having a molecular weight of 500 to 100,000, and expressed by the formulas (V), (VI), (VII) and (VIII) described above.

DESCRIPTION OF THE PREFERRED EMBODIMENTS

In the resin composition according to the present invention, any kind of epoxy resins can be used so long as it is a polyfunctional epoxy resin containing at least two epoxy groups in one molecule thereof. An example of such epoxy resins is a cresol novolak type epoxy resin.

In the resin composition according to the present invention, 50 to 150 parts by weight of a curing agent is added per 100 parts by weight of the epoxy resin. The curing agents that are useful for the present invention include the phenol novolak resin, cresol novolak resin and the polyallyl phenol resin expressed by the formulas (I), (II), (III) and (IV) given above. When the amount of the curing agent is less than 50 parts by weight, curing does not proceed sufficiently, and if it exceeds 150 parts by weight, heat-resistance of the resin drops.

In the resin composition of the present invention, inorganic fillers are blended so as to improve strength of molding materials. Silica, alumina and calcium carbonate were used as the inorganic filler. The blend amount of the inorganic filler is preferably from 200 to 1,000 parts by weight. If the amount is less than 200 parts by weight, the strength is insufficient, and if it exceeds 1,000 parts by weight, on the other hand, molding becomes difficult due to the increase in the viscosity.

Further, the resin composition is characterized in that a silicone type flexibility imparting agent for a thermosetting resin is blended. When this agent is blended, the modulus of elasticity of the cured product as well as the stress can be reduced. The flexibility imparting agents that can be used effectively for the present invention include the silicone compounds expressed by the formulas (V), (VI), (VII) and (VIII) already given.

The blend amount of the flexibility imparting agent is from 5 to 50 parts by weight. When the amount is less than 5 parts by weight, the blend effect is not sufficient and if it exceeds 50 parts by weight, heat-resistance drops.

In the resin composition according to the present invention, the following components can further be blended, whenever necessary.

(1) Coupling agent:

The coupling agent used in the present invention improves adhesion between the inorganic filler and the resin, and a silane type coupling agent such as 3-glycidoxypropyl trimethoxysilane is particularly preferred, because such a coupling agent has high compatibility with the inorganic filler.

The blend amount of the coupling agent is from 0 to 40 parts by weight per 100 parts by weight of the epoxy resin (hereinafter the same) and preferably, from 5 to 30 parts by weight.

(2) Mold release agent:

Carnauba wax, stearates, montanic acid, ester wax, etc., can be blended as a mold release agent to improve the working factor during molding.

The blend amount is from 0 to 10 parts by weight, preferably from 0.5 to 5 parts by weight, in consideration of adhesion with a lead frame and a Si chip.

(3) Flame retardant:

Phosphazene compounds provide the effect as a flame retardant. To further improve flame retardancy, however, brominated epoxy resins and antimony trioxide can be blended.

The blend amount is from 0 to 50 parts by weight and preferably, from 5 to 30 parts by weight.

(4) Pigment:

Carbon black, etc., can be blended, and the blend amount is from 0 to 10 parts by weight and preferably, from 0.5 to 5 parts by weight.

(5) Curing promoter:

A phosphine type or imidazole type curing promoter can be blended, whenever necessary. The blend amount is from 0 to 30 parts by weight and preferably, from 0.5 to 20 parts by weight.

The silicone compounds expressed by the formulas (V) to (VIII) are useful as the flexibility imparting agent for not only the epoxy resin but also for maleimide resins, polyimide resins, melamine resins, urea resins and phenolic resins.

The silicone compound expressed by the formula (V) can be produced by reacting a silphenylene compound expressed by the following formula (X)

(where $R_1$ is a lower alkyl group, and $R_4$ is a lower alkoxy group or a halogen atom) with a silicon compound expressed by the following formula (XI):

(where $R_2$ and $R_3$ are mutually independently a vinyl group or a lower alkyl group or a phenyl group, and $R_5$ is a lower alkoxy group or a halogen atom).

The lower alkyl group defined above means an alkyl group having 1 to 4 carbon atoms, and is preferably an alkyl group having 1 to 2 carbon atoms. The lower alkoxy group means an alkoxy group having 1 to 4 carbon atoms, and is preferably an alkoxy group having 1 to 2 carbon atoms. The halogen atom means a chlorine atom, a bromine atom, an iodine atom or a fluorine atom, and is preferably the chlorine atom.

Preferably, the silicone compound described above has a weight average molecular weight of from 500 to 100,000. If the molecular weight is less than 500, heat-resistance and flexibility of the resin composition deteriorate and if it exceeds 100,000, bleed-out on the surface of a cured product due to the decrease in compatibility with the composition and the decrease in heat-resistance occurs.

The silicone compound described above can also be obtained by the copolymerization of the silphenylene compound of the formula (X) with the silicon compound of the formula (XI).

Preferably, the copolymerization reaction is carried out in a solvent using a polymerization reaction catalyst.

Examples of the solvent include toluene, methyl isobutyl ketone, methyl ethyl ketone, methyl cellosolve, ethyl cellosolve, butyl cellosolve, N-methyl-2-pyrrolidone, dimethylacetoamide, dimethylformamide, dimethyl sulfoxide, and so forth. All of these solvents are first dehydrated and then used. At times, two or more solvents may be mixed to obtain a mixed solvent.

In the present invention, the functional groups of the monomer are first hydrolyzed to form a silanol and are then polymerized by carrying out the dehydration condensation reaction. An acid catalyst such as hydrochloric acid, sulfuric acid or nitric acid can be used preferably as the catalyst for promoting this dehydration condensation reaction.

In the present invention, the hydroxyl group as the terminal group may be silyllated for the purpose of preservation stabilization. Examples of the silyllation agent may be a mono-functional chlorosilane such as trimethylchlorosilane, triphenylchlorosilane, trivinylchlorosilane, divinylmethylchlorosilane, dimethylvinylchlorosilane, divinylphenylchlorosilane, diphenylvinylchlorosilane, methylphenylvinylchlorosilane, and so forth. A basic catalyst such as pyridine or triethylamine may be used in order to promote silyllation.

The reaction can be carried out preferably within the reaction temperature of from 60° to 150° C.

As described above, the silicone compound is produced by the copolymerization of the monomer (X) with the monomer (XI). It is to be noted carefully in this instance that if the functional groups of $R_4$ and $R_5$ are the same and if hydrolysis is effected simultaneously, the polymerization reaction will be impeded due to the difference of a conjugate system and a non-conjugated system and a straight chain property. The present invention can solve this problem by the use of $R_4$ and $R_5$ having mutually different functional groups (e.g., $R_4$ having a methoxy group and $R_5$ having a hydrogen (chloro) group). In other words, the present invention can produce a silicone compound having a high copolymerization ratio.

The silicone compound expressed by the formula (VI) given already can be produced by reacting a compound expressed by the following formula (XII):

(where $R_1$ and $R_2$ may be the same or different and are mutually independently a lower alkyl group or a phenyl group, $R_3$ and $R_4$ may be the same or different and are mutually independently a lower alkyl group or a phenyl group, and n is an integer of from 3 to 500), with a maleic anhydride expressed by the following formula (XIII):

The silicone compound expressed by the formula (VII) given already can be produced by reacting a compound expressed by the following general formula (XIV):

(where $R_5$ is a lower alkyl group, and n is a positive integer), with a maleic anhydride.

Furthermore, the silicone compound expressed by the formula (VIII) given already can be produced by reacting a compound expressed by the following general formula (XV):

(where $R_6$ is a lower alkyl group, $R_7$ to $R_{10}$ may be the same or different and are mutually independently a lower alkyl group or a phenyl group, m and n are positive integers, and n:m represents a proportion of from 0.2:1 to 2:1),
with maleic anhydride.

In the present invention, the lower alkyl group defined above means an alkyl group having 1 to 4 carbon atoms, preferably an alkyl group having 1 to 2 carbon atoms and more preferably a methyl group.

The molecular weight of the terminal maleimidepropyl modified silicone compounds of the formulas (VI) to (VIII) is preferably from 500 to 100,000. If the molecular weight is less than 500, heat-resistance, flexibility and crack resistance of the composition deteriorate, and if it exceeds 100,000, bleed-out occurs on the surface of the cured product due to the decrease in compatibility with the composition, and heat-resistance deteriorates.

Typical examples of these silicone compounds are as follows:

(1) terminal maleimide propyl polydimethylsiloxane
(2) terminal maleimide propyl polydiphenylsiloxane
(3) terminal maleimide propyl polymethylphenylsiloxane
(4) terminal maleimide propyl polytetramethylsilphenylenedisiloxane
(5) terminal maleimide propyl polytetramethylsilphenylene disiloxane/polydimethylsiloxane copolymer
(6) terminal maleimide propyl polysilphenylenedisiloxane/polydiphenylsiloxane copolymer and
(7) terminal maleimide propyl polysilphenylenedisiloxane/polymethylphenylsiloxane copolymer The terminal maleimide propyl modified silicone compound according to the present invention is produced using a silicone compound which has an aminopropyl group at its terminal and the skeletal structure of which has a molecular weight of from 500 to 100,000 as recited in the Scope of Claim for Patent, as the starting compound, reacting this starting compound with maleic anhydride in a theoretical amount or greater than the former, to form an amic acid as a precursor, and then carrying out the dehydration condensation reaction with an acid catalyst. The reaction temperature is from 100° to 150° C.

The reagents that are used for the production are as follows.

(Maleic anhydride)

Maleic anhydrides used for the present invention are not limited, in particular, so long as they are of the reagent first class.

(Reaction solvent)

Examples of the reaction solvent are toluene, acetone, methyl isobutyl ketone, methyl ethyl ketone, cellosolves, methyl pyrrolidone, dimethylformamide, and so forth. All of them are used after they are dehydrated. In some cases, a mixed solvent of two or more of them may be used.

(Acid catalyst)

The acid catalyst used for the present invention is hydrochloric acid, sulfuric acid, nitric acid, acetic acid, toluenesulfonic acid, and so forth.

The starting polymers expressed by the formulas (XII), (XIV) and (XV) in the production method of the present invention can be produced by aminopropylating predetermined silicone polymers of the starting materials, for example.

The predetermined silicone polymers of the starting materials can be obtained, for example, by dissolving a silicone monomer expressed by the following general formula (XVI) in a reaction solvent, adding water dropwise at a normal temperature, hydrolyzing a chloro group or an alkoxy group by adding water dropwise from in the reaction system, and carrying out the dehydration condensation reaction at 60° to 150° C.:

(where $R_1$ is a chloro group or a lower alkoxy group, and $R_2$ and $R_3$ may be the same or different and represent mutually independently a lower alkyl group or a phenyl group).

The reaction conditions are as follows.

(Reaction solvent)

Examples of the reaction solvent include ketones such as methyl ethyl ketone and methyl isobutyl ketone, and cellosolves such as methyl cellosolve and ethyl cellosolve. However, the reaction solvent is not particularly limited so long as it has high solubility of the monomers and the polymer, and has a boiling point of not lower than 60° C.

(Reaction condition)

The reaction temperature is preferably from 60 to 150° C. and the reaction time is from 0.5 to 48 hours.

(Reaction catalyst)

The present invention uses an acid catalyst so as to promote the dehydration condensation reaction between the monomers. Examples of the acid catalyst include hydrochloric acid, sulfuric acid, nitric acid and acetic acid.

The starting polymers can be produced by aminopropylating the resulting silicone polymers by the use of a silazane type monomer expressed by the following formula (XVII):

The reaction solvent and the reaction condition for aminopropylation are as follows, for example.

(Reaction solvent)

Examples of the reaction solvent are ketones such as methyl ethyl ketone and methyl isobutyl ketone, and cellosolves such as methyl cellosolve and ethyl cellosolve, but the reaction solvent is not particularly limited so long as it has high solubility for the monomers and the polymers and has a boiling point of not lower than 50° C.

(Reaction condition)

The reaction temperature is preferably from 50 to 100° C., and the reaction time is from 0.5 to 48 hours.

Hereinafter, the present invention will be explained further with reference to Examples thereof. Needless to say, however, the present invention is not particularly limited to these Examples.

EXAMPLES 1 TO 9, COMPARATIVE EXAMPLES 1 TO 3

These Examples used the following starting materials.

epoxy resin
cresol novolak type epoxy resin, product of Nihon Kayaku, EOCN-1025
phenol novolak resin, product of Dai-Nippon Ink, TD-2131
polyallylphenol (compound of the formula IV)
vinyl group-containing silicon compound
silica
coupling agent, product of Chisso K.K., 3-glycidoxypropyl trimethoxysi lane)
brominated epoxy
ester wax, product of Hoechst Japan, Hoechst wax OP
pigment
triphenylphosphine The compositions shown in Examples and Comparative Examples were prepared by kneading together the starting materials by a pressure kneader. Each of the testpieces was produced in the following way.

First of all, each of the compositions obtained by kneading was converted to powder of 8-mesh pass, and this powder was then transferred to a press mold and was compression molded at 200° C. and 80 kg/cm² for 20 minutes. The resulting molded article was further after-cured at 200° C. for 8 hours.

The characteristic properties of each of the testpieces obtained in this way were evaluated in the following way.

glass transition temperature: thermo-mechanical analyzer (943TMA, DuPont)
bending strength: JIS K6911
bending elastic modulus: JIS K6911
water absorption ratio: JIS K6911
mold releasability: the number of times of molding when molding was repeatedly effected on a chromium-plated plate, and bonding power
adhesion with Si chip: Peel state was observed non-destructively by ultrasonic fault detector of molded packages The results of Examples and Comparative Examples are tabulated in Table 1.

TABLE 1

| | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 | Comp. Ex. 3 |
|---|---|---|---|---|---|---|---|---|---|---|---|---|
| Composition (parts) | | | | | | | | | | | | |
| epoxy resin | 100 | 100 | 100 | 100 | 100 | 100 | 100 | 100 | 100 | 100 | 100 | 100 |
| bis-maleimide | — | — | — | — | — | — | 20 | 20 | 20 | — | — | 20 |
| polyallyl phenol | 70 | 70 | 70 | — | — | — | 70 | 70 | 70 | 70 | — | 70 |
| phenol novolak | — | — | — | 70 | 70 | 70 | — | — | — | — | 70 | — |
| vinyl-containing silicone | 5 | 10 | 15 | 5 | 10 | 15 | 5 | 10 | 15 | — | — | — |
| silica | 900 | 900 | 900 | 900 | 900 | 900 | 900 | 900 | 900 | 900 | 900 | 900 |
| coupling agent | 4 | 4 | 4 | 4 | 4 | 4 | 4 | 4 | 4 | 4 | 4 | 4 |
| brominated epoxy | 15 | 15 | 15 | 15 | 15 | 15 | 15 | 15 | 15 | 15 | 15 | 15 |
| ester wax | 2 | 2 | 2 | 2 | 2 | 2 | 2 | 2 | 2 | 2 | 2 | 2 |
| pigment | 1 | 1 | 1 | 1 | 1 | 1 | 1 | 1 | 1 | 1 | 1 | 1 |
| triphenyl phosphine | 1 | 1 | 1 | 1 | 1 | 1 | 1 | 1 | 1 | 1 | 1 | 1 |
| glass transition temp. (°C.) | 162 | 160 | 161 | 164 | 163 | 162 | 224 | 228 | 225 | 155 | 153 | 201 |
| bending strength (kgF/mm²) | | | | | | | | | | | | |
| 25° C. | 13 | 12 | 15 | 12 | 11 | 13 | 16 | 14 | 14 | 8 | 8 | 10 |
| 250° C. | 8 | 8 | 8 | 8 | 7 | 8 | 10 | 9 | 10 | 5 | 6 | 6 |
| bending elastic modulus (kgf/cm²) | 1600 | 1540 | 1500 | 1630 | 1600 | 1550 | 1720 | 1650 | 1600 | 2120 | 2260 | 2400 |
| water absorption ratio (%) | 0.2 | 0.2 | 0.2 | 0.2 | 0.2 | 0.2 | 0.2 | 0.3 | 0.2 | 0.4 | 0.5 | 0.6 |
| mold releasability | | | | | | | | | | | | |
| 1st time | 8 | 6 | 7 | 9 | 7 | 8 | 9 | 10 | 9 | 18 | 15 | 19 |
| 2nd time | 7 | 6 | 4 | 7 | 6 | 5 | 10 | 8 | 7 | 12 | 14 | 18 |
| adhesion with Si chip | ◎ | ◎ | ◎ | ○ | ◎ | ◎ | ○ | ○ | ◎ | Δ | x | x |

EXAMPLE 10

Figure 1:
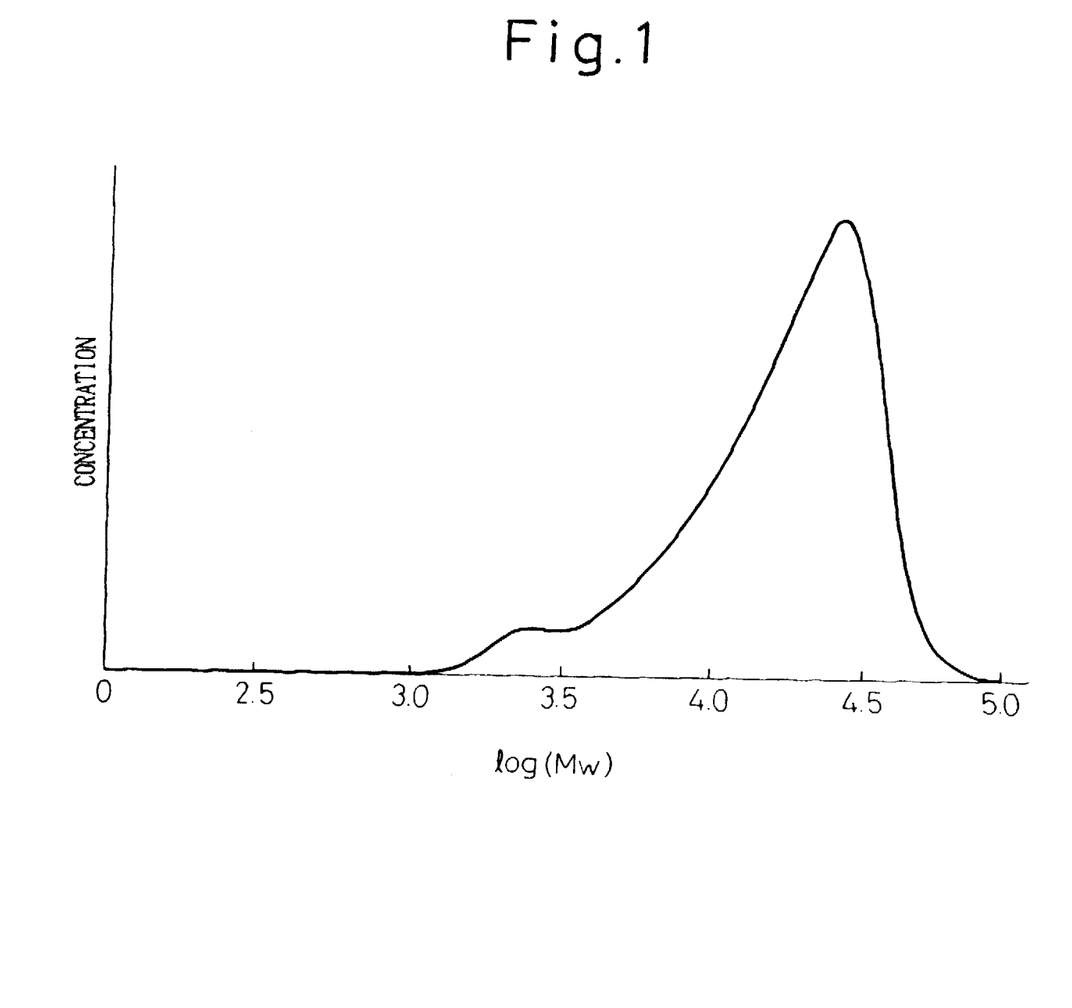
FIG. 1 is a graph showing a weight average molecular weight of a silicone compound according to an embodiment of the present invention.
Figure 2:
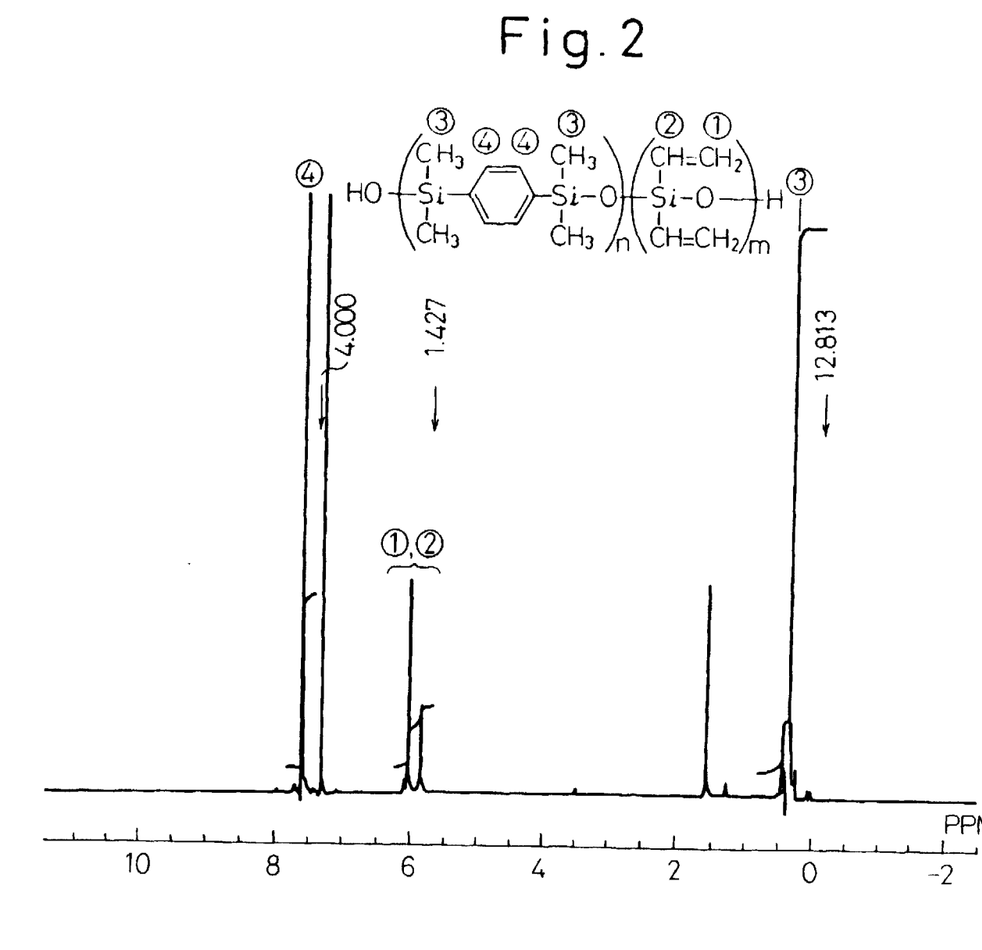
FIG. 2 is a chart showing a $^1$H-NMR spectrum of the silicone compound according to an embodiment of the present invention.

91.6 g (0.4 mol) of 1,4-bis(dimethylmethoxysilyl) benzene and 32.26 g (0.2 mol) of divinyldichlorosilane were dissolved in 200 g of methyl isobutyl ketone, and the resulting solution was fed into a reaction vessel. After 25.2 g (1.4 mol) of pure water was added dropwise, the mixture was left standing for 30 minutes. 1.5 g of hydrochloric acid was added, and the mixture was heated at 118° C. for 5 hours. In this instance, an $N_2$ gas was bubbled and residual water at the time of hydrolysis as well as reaction condensation water were removed. The resulting reaction solution was washed five times by a separating funnel and was then condensed at 10 mmHg and 70° C. The resulting product was dissolved in benzene and freeze-dried to yield 78 g of a silicone compound. The resulting compound was found to have a weight average molecular weight of 22,000 (FIG. 1) by gel permeation chromatogram. The existence of a vinyl group around 6 ppm could be confirmed from a $^1$H-NMR spectrum (FIG. 2) and its content was about 0.25 with respect to 1 of silphenylene monomer.

EXAMPLE 11

91.6 g (0.4 mol) of 1,4-bis(dimethylmethoxysilyl) benzene and 60.52 g (0.4 mol) of divinyldichlorosilane were dissolved in 200 g of methyl isobutyl ketone, and the resulting solution was fed into a reaction vessel. After 28.8 g (1.6 mol) of pure water was added dropwise, the mixture was left standing for 30 minutes. 1.5 g of hydrochloric acid was added, and the mixture was heated at 118° C. for 5 hours. In this case, the $N_2$ gas was bubbled, and residual water at the time of hydrolysis as well as reaction condensation water were removed. The resulting reaction solution was washed five times by a separating funnel and was then concentrated at 10 mmHg and 70° C. The resulting product was dissolved in benzene and was freeze-dried to yield 89 g of a silicone compound.

This silicone compound was found to have a weight average molecular weight of 18,000 by gel permeation chromatogram.

APPLICATION EXAMPLE 1

100 parts of a cresol novolak type epoxy resin (epoxy equivalent of 200), 50 parts of a phenol novolak resin (hydroxyl group equivalent of 105), 1 part of triphenyl phosphine and 5 parts of the silicone compound obtained by Example 10 were heated and mixed, and were cured at 150° C. for 10 hours. The glass transition temperature, the modulus of elasticity, the water absorption ratio and adhesion with an aluminum sheet were evaluated.

In all the Application Examples, the properties were evaluated in accordance with the following test standards and the test methods.

glass transition temperature: thermo-mechanical analyzer (943TMA, DuPont)

modulus of elasticity: dynamic viscoelasticity meter (983DMA, DuPont)

adhesion: The resin was cured on the aluminum sheet (180° C. for 1 hour) and a peel state was observed by an ultrasonic flaw detector.

The results were tabulated in later-appearing Tables 2 and 3. In these Tables, the standard for evaluation and judgement of adhesion is as follows:

◎: no peel, o: minimum peel, Δ: half surface peel x: entire surface peel

APPLICATION EXAMPLE 2

100 parts of a cresol novolak type epoxy resin (epoxy equivalent of 200), 50 parts of a phenol novolak resin (hydroxyl group equivalent of 105), 1 part of triphenyl phosphine and 10 parts of the silicone compound obtained in Example 10 were heated and mixed, and were cured at 150° C. for 10 hours. The glass transition temperature, the modulus of elasticity, the water absorption ratio and adhesion with the aluminum sheet were evaluated. The results were tabulated in later-appearing Table 2.

APPLICATION EXAMPLE 3

100 parts of cresol novolak type epoxy resin (epoxy equivalent of 200), 50 parts of a phenol novolak resin (hydroxyl group equivalent of 105), 1 part of triphenyl phosphine and 15 parts of the silicone compound obtained in Example 10 were heated and mixed, and were cured at 150° C. for 10 hours. The glass transition temperature, the water absorption ratio and adhesion with the aluminum sheet were evaluated. The results were tabulated in later-appearing Table 2.

APPLICATION EXAMPLE 4

100 parts of a cresol novolak type epoxy resin (epoxy equivalent of 200), 50 parts of a phenol novolak resin (hydroxyl group equivalent of 105), 1 part of triphenyl phosphine and 5 parts of the silicone compound obtained in Example 11 were heated and mixed, and were cured at 150° C. for 10 hours. The glass transition temperature, the modulus of elasticity, the water absorption ratio and adhesion with the aluminum sheet were evaluated. The results were tabulated in later-appearing Table 2.

APPLICATION EXAMPLE 5

100 parts of a cresol novolak type epoxy resin (epoxy equivalent of 200), 50 parts of a phenol novolak resin (hydroxyl group equivalent of 105), 1 part of triphenyl phosphine and 10 parts of the silicone compound obtained in Example 11 were heated and mixed, and were cured at 150° C. for 10 hours. The glass transition temperature, the modulus of elasticity, the water absorption ratio and adhesion with the aluminum sheet were evaluated. The results were tabulated in later-appearing Table 2.

APPLICATION EXAMPLE 6

100 parts of a cresol novolak type epoxy resin (epoxy equivalent of 200), 50 parts of a phenol novolak resin (hydroxyl group equivalent of 105), 1 part of triphenyl phosphine and 15 parts of the silicone compound obtained in Example 11 were heated and mixed, and were cured at 150° C. for 10 hours. The glass transition temperature, the modulus of elasticity, the water absorption ratio and adhesion with the aluminum sheet were evaluated. The results were tabulated in later-appearing Table 2.

APPLICATION EXAMPLE 7

100 parts of bis-maleimide, 50 parts of diaminodiphenylmethane and 5 parts of the silicone compound obtained in Example 10 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

APPLICATION EXAMPLE 8

100 parts of bis-maleimide, 50 parts of diaminodiphenylmethane and 10 parts of the silicone compound obtained in Example 10 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

APPLICATION EXAMPLE 9

100 parts of bis-maleimide, 50 parts of diaminodiphenylmethane and 15 parts of the silicone compound obtained in Example 10 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

APPLICATION EXAMPLE 10

100 parts of bis-maleimide, 50 parts of diaminodiphenylmethane and 5 parts of the silicone compound obtained in Example 11 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

APPLICATION EXAMPLE 11

100 parts of bis-maleimide, 50 parts of diaminodiphenylmethane and 10 parts of the silicone compound obtained in Example 11 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

APPLICATION EXAMPLE 12

100 parts of bis-maleimide, 50 parts of diaminodiphenylmethane and 15 parts of the silicone compound obtained in Example 11 were heated and mixed, and were cured at 200° C. for 10 hours. The glass transition temperature, the modulus of elasticity, the water absorption ratio and adhesion with the aluminum sheet were evaluated. The results were tabulated in later-appearing Table 3.

COMPARATIVE EXAMPLE 4

100 parts of a cresol novolak type epoxy resin (epoxy equivalent of 200), 50 parts of a phenol novolak resin (hydroxyl group equivalent of 105), 1 part of triphenylphosphine were heated and mixed, and were cured at 150° C. for 10 hours. The glass transition temperature, the modulus of elasticity, the water absorption ratio and adhesion with the aluminum sheet were evaluated. The results were tabulated in later-appearing Table 2.

COMPARATIVE EXAMPLE 5

100 parts of bis-maleimide and 50 parts of diaminodiphenylmethane were heated and mixed, and were cured at 200° C. for 10 hours. The glass transition temperature, the modulus of elasticity, the water absorption ratio and adhesion with the aluminum sheet were evaluated. The results were tabulated in Table 3.

TABLE 2

|  | Application Examples |  |  |  |  |  | Comp. Example 4 |
|---|---|---|---|---|---|---|---|
|  | 1 | 2 | 3 | 4 | 5 | 6 | |
| cresol novolak type epoxy | 100 | 100 | 100 | 100 | 100 | 100 | 100 |
| phenol novolak resin | 50 | 50 | 50 | 50 | 50 | 50 | 50 |
| triphenyl phosphine | 1 | 1 | 1 | 1 | 1 | 1 | 1 |
| silicone compound (1) | 5 | 10 | 15 | — | — | — | — |
| silicone compound (2) | — | — | — | 5 | 10 | 15 | — |
| glass transition temp. (°C.) | 167 | 168 | 168 | 162 | 163 | 163 | 152 |
| modulus of elasticity (Gpa) | 2.4 | 2.2 | 2.1 | 2.0 | 2.1 | 1.8 | 2.9 |
| water absorption ratio (%) | 0.4 | 0.4 | 0.4 | 0.4 | 0.3 | 0.3 | 0.7 |
| adhesion | ○ | ○ | ⊙ | ○ | ⊙ | ⊙ | x |

TABLE 3

|  | Application Examples |  |  |  |  |  | Comp. Example 4 |
|---|---|---|---|---|---|---|---|
|  | 7 | 8 | 9 | 10 | 11 | 12 | |
| bis-maleimide | 100 | 100 | 100 | 100 | 100 | 100 | 100 |
| diaminodiphenylmethane | 50 | 50 | 50 | 50 | 50 | 50 | 50 |
| silicone compound (1) | 5 | 10 | 15 | — | — | — | — |
| silicone compound (2) | — | — | — | 5 | 10 | 15 | — |
| glass transition temp. (°C.) | 284 | 287 | 286 | 278 | 279 | 279 | 274 |
| modulus of elasticity (Gpa) | 2.6 | 2.4 | 2.4 | 2.5 | 2.3 | 2.1 | 3.3 |
| water absorption ratio (%) | 0.5 | 0.5 | 0.4 | 0.4 | 0.4 | 0.5 | 0.9 |
| adhesion | ○ | ○ | ⊙ | ○ | ⊙ | ⊙ | x |

EXAMPLE 12

21.56 g (0.22 mol) of maleic anhydride was dissolved in 105.5 g of toluene and 19.8 g of acetone, and was fed into a reaction vessel. 100 g (0.1 mol) of a terminal aminopropyl polydimethylsiloxane of formula (XII) solution-in 55.5 g of toluene, having a mean molecular weight of 1,000, was dropped through a dropping funnel at a normal temperature in the course of 30 minutes. After the solution was left standing for 2 hours, 2 g of hydrochloric acid was added and the reaction was carried out at 112° C. for 5 hours. At this time, the reaction was conducted while removing condensation water obtained from the reaction. After the resulting product was washed five times with pure water, it was dried at 70° C. and 10 mmHg to yield 96 g of a product.

Figure 3:
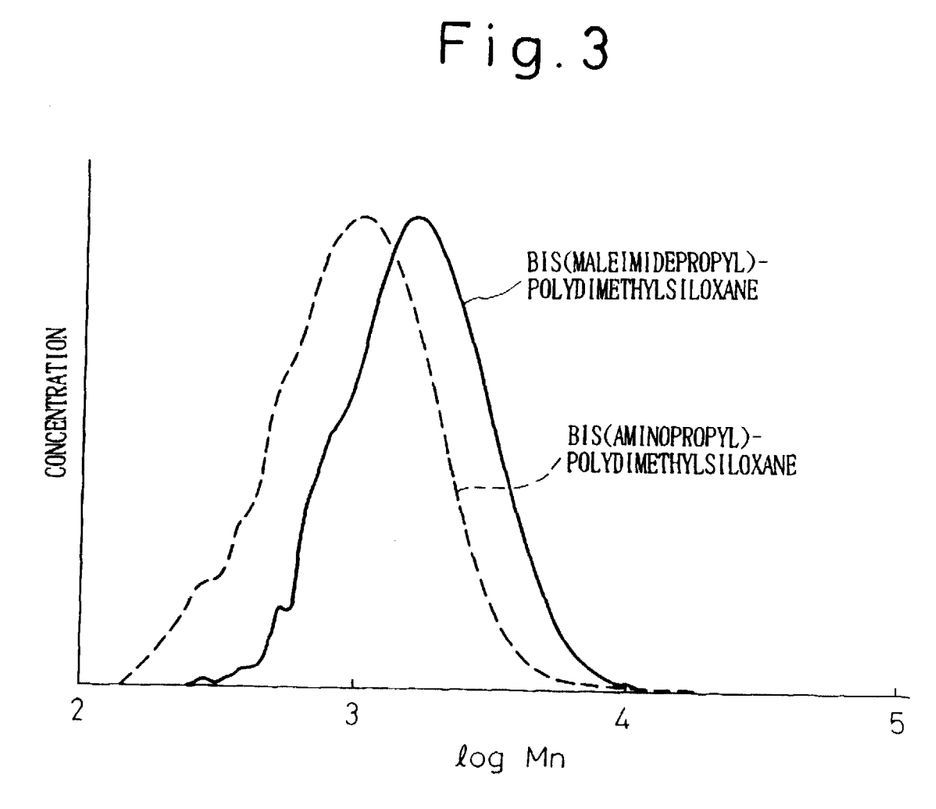
FIG. 3 is a graph showing a molecular weight distribution of a silicone compound according to an embodiment (Example 12) of the present invention.
Figure 4:
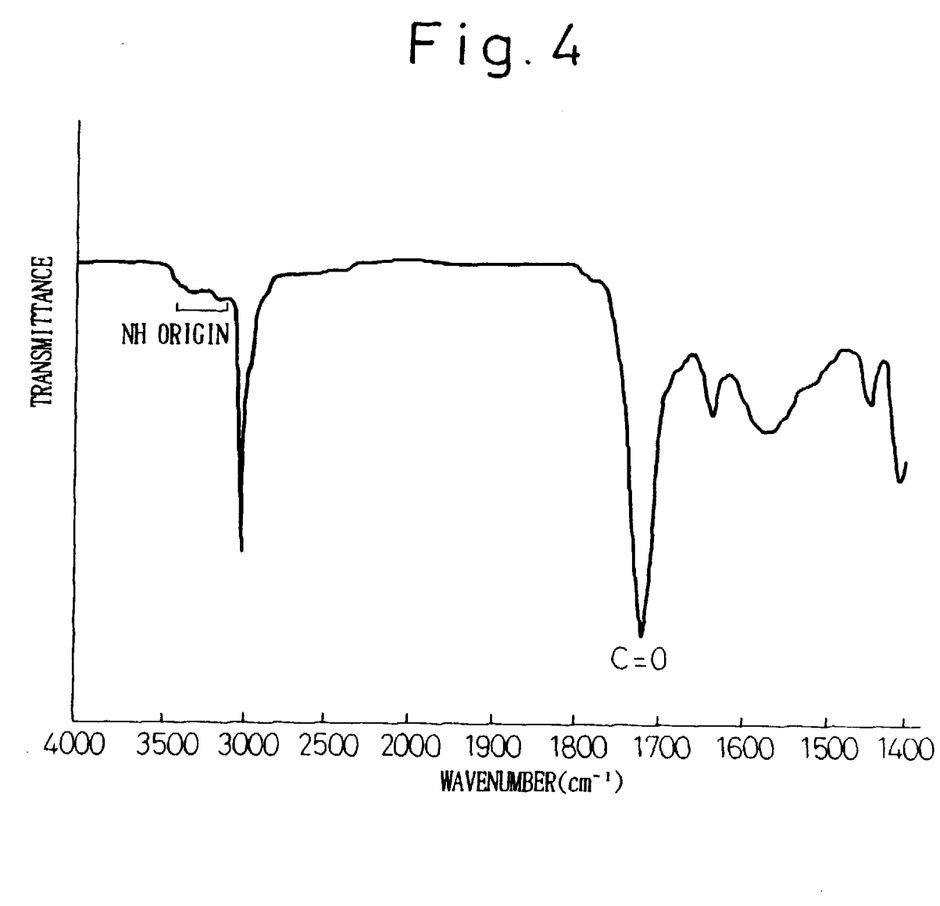
FIG. 4 is a chart of an infrared absorption spectrum of the silicone compound according to an embodiment (Example 12) of the present invention.

The resulting product was found to have a mean molecular weight of about 1,400 (FIG. 3) according to a GPC measurement method. It could be confirmed by an infrared spectrophotometry that absorption of —NH disappeared and absorption of —C=O in the maleimide ring of 1,720 cm$^{-1}$ (FIG. 4) was confirmed.

EXAMPLE 13

21.56 g (0.22 mol) of maleic anhydride was dissolved in 105.5 g of toluene and 19.8 g of acetone, and was fed into the reaction vessel. 100 g (0.1 mol) of a solution of terminal aminopropyl polydiphenylsiloxane of formula (XII) having a mean molecular weight of 1,000 and dissolved in 55.5 g of toluene was dropped through a dropping funnel at a normal temperature in the course of 30 minutes. After the solution was left standing for 2 hours, 2 g of hydrochloric acid was added and the reaction was carried out at 112° C. for 5 hours. At this time, the reaction was conducted while removing condensation water obtained from the reaction. After the resulting product was washed five times with pure water, it was dried at 70° C. and 10 mmHg to yield 92 g of a product.

The resulting product was found to have a mean molecular weight of about 1,310 according to the GPC measurement method.

EXAMPLE 14

21.56 g (0.22 mol) of maleic anhydride was dissolved in 105.5 g of toluene and 19.8 g of acetone, and the solution was fed into a reaction vessel. 100 g of a solution of terminal aminopropylpolymethylphenylsiloxane of formula (XII) dissolved in 55.5 g of toluene and having a mean molecular weight of 1,000 was dropped through a dropping funnel at a normal temperature in the course of 30 minutes. After the solution was left standing for 2 hours, 2 g of hydrochloric acid was added and the reaction was carried out at 112° C. for 5 hours. At this time, the reaction was conducted while removing condensation water obtained from the reaction. After the resulting product was washed five times with pure water, it was dried at 70° C. and 10 mmHg to yield 95 g of a product.

The resulting product was found to have a mean molecular weight of about 1,430 according to a GPC measurement method.

EXAMPLE 15

21.56 g (0.22 mol) of maleic anhydride was dissolved in 105.5 g of toluene and 19.8 g of acetone, and the solution was fed into a reaction vessel. 100 g (0.1 mol) of a solution of terminal aminopropylpolytetramethylsilphenylenedisiloxane of formula (XIV) dissolved in 55.5 g of toluene and having a mean molecular weight of 1,000 was dropped through a dropping funnel at a normal temperature in the course of 30 minutes. After the solution was left standing for 2 hours, 2 g of hydrochloric acid was added and the reaction was carried out at 112° C. for 5 hours. At this time, the reaction was conducted while removing condensation water obtained from the reaction. After the resulting product was washed five times with pure water, it was dried at 70° C. and 10 mmHg to yield 90 g of a product.

The resulting product was found to have a mean molecular weight of about 1,220 according to a GPC measurement method.

EXAMPLE 16

21.56 g (0.22 mol) of maleic anhydride was dissolved in 105.5 g of toluene and 19.8 g of acetone, and the solution was fed into a reaction vessel. 100 g (0.1 mol) of a solution of terminal aminopropylpolytetramethylsilphenylenedisiloxane/ polydimethylsiloxane copolymer of formula (XV) dissolved in 55.5 g of toluene and having a mean molecular weight of 1,000 was passed through a dropping funnel at a normal temperature in the course of 30 minutes. After the solution was left standing for 2 hours, 2 g of hydrochloric acid was added and the reaction was carried out at 112° C. for 5 hours. At this time, the reaction was conducted while removing condensation water obtained from the reaction. After the resulting product was washed five times with pure water, it was dried at 70° C. and 10 mmHg to yield 93 g of a product.

The resulting product was found to have a mean molecular weight of about 1,420 according to a GPC measurement method.

EXAMPLE 17

21.56 g (0.22 mol) of maleic anhydride was dissolved in 105.5 g of toluene and 19.8 g of acetone, and the solution was fed into a reaction vessel. 100 g (0.1 mol) of a solution of terminal aminopropylpolytetramethylsilphenylenedisiloxane/ polydiphenylsiloxane copolymer of formula (XV) dissolved in 55.5 g of toluene and having a mean molecular weight of 1,000 was passed through a dropping funnel at a normal temperature in the course of 30 minutes. After the solution was left standing for 2 hours, 2 g of hydrochloric acid was added, and the reaction was carried out of 112° C. for 5 hours. At this time, the reaction was conducted while removing condensation water obtained from the reaction. After the resulting product was washed five times with pure water, it was dried at 70° C. and 10 mmHg to yield 95 g of a product.

The resulting product was found to have a mean molecular weight of about 1,400 according to a GPC measurement method.

EXAMPLE 18

21.56 g (0.22 mol) of maleic anhydride was dissolved in 105.5 g of toluene and 19.8 g of acetone, and the solution was fed into a reaction vessel. 100 g of a solution of terminal aminopropylpolytetramethylsilphenylenedisiloxane/ polymethylphenylsiloxane copolymer of formula (XV) dissolved in 55.5 g of toluene and having a mean molecular weight of 1,000 was passed through a dropping funnel at a normal temperature in the course of 30 minutes. After the solution was left standing for 2 hours, 2 g of hydrochloric acid was added, and the reaction was carried out at 112° C. for 5 hours. At this time, the reaction was conducted while removing condensation water obtained from the reaction. After the resulting product was washed five times with pure water, it was dried at 70° C. and 10 mmHg to yield 93 g of a product.

The resulting product was found to have a mean molecular weight of about 1,370 according to a GPC measurement method.

APPLICATION EXAMPLE 13

100 parts by weight of an epoxy resin, 50 parts of diaminodiphenylmethane and 10 parts by weight of a terminal maleimidepropyl modified silicone compound of formula (VI) obtained in Example 12 were heated and mixed, and were cured at 150° C. for 10 hours. The glass transition temperature, the water absorption ratio, the modulus of elasticity, cracks and mold releasability were evaluated (Table 4).

In Table 4, the cracks were evaluated in accordance with the following standard.

502 : no crack ○: very small crack △: crack below 2 mm x: crack greater than 2 mm

APPLICATION EXAMPLE 14

100 parts by weight of an epoxy resin, 50 parts by weight of diaminodiphenylmethane and 10 parts by weight of a terminal maleimidepropyl modified silicone compound of formula (VI) obtained in Example 13 were heated and mixed, and were cured at 150° C. for 10 hours. The glass transition temperature, the water absorption ratio, the modulus of elasticity, cracks and mold releasability were evaluated (Table 4).

APPLICATION EXAMPLE 15

100 parts by weight of an epoxy resin, 50 parts by weight of diaminodiphenylmethane and 10 parts by weight of a terminal maleimidepropyl modified silicone compound of formula (VI) obtained in Example 14 were heated and mixed, and were cured at 150° C. for 10 hours. The glass transition temperature, the water absorption ratio, the modulus of elasticity, cracks and mold releasability were evaluated (Table 4).

APPLICATION EXAMPLE 16

100 parts by weight of an epoxy resin, 50 parts by weight of diaminodiphenylmethane and 10 parts by weight of a terminal maleimidepropyl modified silicone compound of formula (VII) obtained in Example 15 were heated and mixed, and were cured at 150° C. for 10 hours. The glass transition temperature, the water absorption ratio, the modulus of elasticity, cracks and mold releasability were evaluated (Table 4).

APPLICATION EXAMPLE 17

100 parts by weight of an epoxy resin, 50 parts by weight of diaminodiphenylmethane and 10 parts by weight of a terminal maleimidepropyl modified silicone compound of formula (VIII) obtained in Example 16 were heated and mixed, and were cured at 150° C. for 10 hours. The glass transition temperature, the water absorption ratio, the modulus of elasticity, cracks and mold releasability were evaluated (Table 4).

APPLICATION EXAMPLE 18

100 parts by weight of an epoxy resin, 50 parts by weight of diaminodiphenylmethane and 10 parts by weight of a terminal maleimidepropyl modified silicone compound of formula (VIII) obtained in Example 17 were heated and mixed, and were cured at 150° C. for 10 hours. The glass transition temperature, the water absorption ratio, the modulus of elasticity, cracks and mold releasability were evaluated (Table 4).

APPLICATION EXAMPLE 19

100 parts by weight of an epoxy resin, 50 parts by weight of diaminodiphenylmethane and 10 parts by weight of a terminal maleimidepropyl modified silicone compound of formula (VIII) obtained in Example 18 were heated and mixed, and were cured at 150° C. for 10 hours. The glass transition temperature, the water absorption ratio, the modulus of elasticity, cracks and mold releasability were evaluated (Table 4).

APPLICATION EXAMPLE 20

100 parts by weight of bis-maleimide, 50 parts by weight of diaminodiphenylmethane and 10 parts by weight of a terminal maleimidepropyl modified silicone compound of formula (VI) obtained in Example 12 were heated and mixed, and were cured at 200° C. for 10 hours. The glass transition temperature, the water absorption ratio, the modulus of elasticity, cracks and mold releasability were evaluated (Table 5).

APPLICATION EXAMPLE 21

100 parts by weight of bis-maleimide, 50 parts of diaminodiphenylmethane and 10 parts by weight of a terminal maleimidepropyl modified silicone compound of formula (VI) obtained in Example 13 were heated and mixed, and were cured at 200° C. for 10 hours. The glass transition temperature, the water absorption ratio, the modulus of elasticity, cracks and mold releasability were evaluated (Table 5).

APPLICATION EXAMPLE 22

100 parts by weight of bis-maleimide, 50 parts of diaminodiphenylmethane and 10 parts by weight of a terminal maleimidepropyl modified silicone compound of formula (VI) obtained in Example 14 were heated and mixed, and were cured at 200° C. for 10 hours. The glass transition temperature, the water absorption ratio, the modulus of elasticity, cracks and mold releasability were evaluated (Table 5).

APPLICATION EXAMPLE 23

100 parts by weight of bis-maleimide, 50 parts by weight of diaminodiphenylmethane and 10 parts by weight of a terminal maleimidepropyl modified silicone compound of formula (VII) obtained in Example 15 were heated and mixed, and were cured at 200° C. for 10 hours. The glass transition temperature, the water absorption ratio, the modulus of elasticity, cracks and mold releasability were evaluated (Table 5).

APPLICATION EXAMPLE 24

100 parts by weight of bis-maleimide, 50 parts by weight of diaminodiphenylmethane and 10 parts by weight of a terminal maleimidepropyl modified silicone compound of formula (VIII) obtained in Example 16 were heated and mixed, and were cured at 200° C. for 10 hours. The glass transition temperature, the water absorption ratio, the modulus of elasticity, cracks and mold releasability were evaluated (Table 5).

APPLICATION EXAMPLE 25

100 parts by weight of bis-maleimide, 50 parts by weight of diaminodiphenylmethane and 10 parts by weight of a terminal maleimidepropyl modified silicone compound of formula (VIII) obtained in Example 17 were heated and mixed, and were cured at 200° C. for 10 hours. The glass transition temperature, the water absorption ratio, the modules of elasticity, cracks and mold releasability were evaluated (Table 5).

APPLICATION EXAMPLE 26

100 parts by weight of bis-maleimide, 50 parts by weight of diaminodiphenylmethane and 10 parts by weight of a terminal maleimidepropyl modified silicone compound of formula (VIII) obtained in Example 18 were heated and mixed, and were cured at 200° C. for 10 hours. The glass transition temperature, the water absorption ratio, the modulus of elasticity, cracks and mold releasability were evaluated (Table 5).

COMPARATIVE EXAMPLE 6

100 parts by weight of an epoxy resin and 50 parts by weight of diaminodiphenylmethane were heated and mixed, and were cured at 150° C. for 10 hours. The glass transition temperature, the water absorption ratio, the modulus of elasticity, cracks and mold releasability were evaluated (Table 4).

COMPARATIVE EXAMPLE 7

100 parts by weight of bis-maleimide and 50 parts by weight of diaminodiphenylmethane were heated and mixed, and were cured at 200° C. for 10 hours. The glass transition temperature, the water absorption ratio, the modulus of elasticity, cracks and mold releasability were evaluated (Table 5).

TABLE 4

| | Application Examples | | | | | | | Comparative |
| | 13 | 14 | 15 | 16 | 17 | 18 | 19 | Example 6 |
|---|---|---|---|---|---|---|---|---|
| Composition (parts) | | | | | | | | |
| epoxy resin | 100 | 100 | 100 | 100 | 100 | 100 | 100 | 100 |
| diaminophenylmethane | 50 | 50 | 50 | 50 | 50 | 50 | 50 | 50 |
| terminal maleimidepropyl silicone compound | | | | | | | | |
| (1) | 10 | — | — | — | — | — | — | — |
| (2) | — | 10 | — | — | — | — | — | — |
| (3) | — | — | 10 | — | — | — | — | — |
| (4) | — | — | — | 10 | — | — | — | — |
| (5) | — | — | — | — | 10 | — | — | — |
| (6) | — | — | — | — | — | 10 | — | — |
| (7) | — | — | — | — | — | — | 10 | — |
| glass transition temperature (°C.) | 171 | 179 | 174 | 180 | 178 | 178 | 178 | 183 |
| water absorption ratio (%) | 0.4 | 0.4 | 0.3 | 0.3 | 0.4 | 0.3 | 0.3 | 0.5 |
| modulus of elasticity (Gpa) | 1.8 | 1.9 | 1.8 | 2.1 | 2.0 | 1.9 | 1.7 | 2.5 |
| cracks | ⊚ | ○ | ⊚ | ○ | ⊚ | ⊚ | ⊚ | x |
| mold releasability (kgf/cm$^2$) | 4 | 4 | 3 | 5 | 5 | 3 | 4 | 8 |

TABLE 5

| | Application Examples | | | | | | | Comparative |
| | 20 | 21 | 22 | 23 | 24 | 25 | 26 | Example 7 |
|---|---|---|---|---|---|---|---|---|
| Composition (parts) | | | | | | | | |
| bis-maleimide | 100 | 100 | 100 | 100 | 100 | 100 | 100 | 100 |
| diaminodiphenylmethane | 50 | 50 | 50 | 50 | 50 | 50 | 50 | 50 |
| terminal maleimidepropyl modified silicone compound | | | | | | | | |
| (1) | 10 | — | — | — | — | — | — | — |
| (2) | — | 10 | — | — | — | — | — | — |
| (3) | — | — | 10 | — | — | — | — | — |
| (4) | — | — | — | 10 | — | — | — | — |
| (5) | — | — | — | — | 10 | — | — | — |
| (6) | — | — | — | — | — | 10 | — | — |
| (7) | — | — | — | — | — | — | 10 | — |
| glass transition temperature (°C.) | 260 | 264 | 261 | 268 | 265 | 263 | 263 | 256 |
| water absorption ratio (%) | 0.5 | 0.5 | 0.4 | 0.5 | 0.4 | 0.5 | 0.4 | 0.7 |
| modulus of elasticity (Gpa) | 2.3 | 2.4 | 2.4 | 2.5 | 2.4 | 2.5 | 2.3 | 2.8 |
| cracks | ⊚ | ○ | ○ | ○ | ○ | ○ | ○ | x |
| mold releasability (kgf/cm$^2$) | 5 | 5 | 4 | 6 | 5 | 6 | 4 | 9 |

We claim:

1. In a cured epoxy resin product, a blended flexibility imparting agent comprising a reaction product derived from a silicone compound expressed by the following general formula (I) and having a weight average molecular weight of 500 to 100,000:

where $R_1$ is an alkyl group having one to four carbon atoms, $R_2$ and $R_3$ are each a vinyl group, m and n are positive integers, and n:m represents a proportion of 0.2:1 to 2:1.

2. In a cured epoxy resin product as set forth in claim 1, an epoxy resin derived from an epoxy resin containing at least two epoxy groups in one molecule thereof.

3. In a curable epoxy resin material, a blended flexibility imparting agent comprising a silicone compound expressed by the following general formula (I) and having a weight average molecular weight of 500 to 100,000:

where $R_1$ is an alkyl group having one to four carbon atoms, $R_2$ and $R_3$ are each a vinyl group, m and n are positive integers, and n:m represents a proportion of 0.2:1 to 2:1.

4. In a curable epoxy resin material as set forth in claim 3, an epoxy resin containing at least two epoxy groups in one molecule thereof.

* * * * *

UNITED STATES PATENT AND TRADEMARK OFFICE
CERTIFICATE OF CORRECTION

PATENT NO. : 5,763,540
DATED : June 9, 1998
INVENTOR(S) : Yoshihiro NAKATA et al.

It is certified that error appears in the above-identified patent and that said Letters Patent is hereby corrected as shown below:

Title Page, Second Column, under OTHER PUBLICATIONS, change "Noii" to --Noll--.

Col. 16, lines 5-7, in Table 3, in the heading for the far right column, change "Example 4" to --Example 5--.

Col. 18, line 41, change "502" to --●--.

Signed and Sealed this

Sixth Day of October, 1998

Attest:

BRUCE LEHMAN

*Attesting Officer*  *Commissioner of Patents and Trademarks*